United States Patent
Jun

(10) Patent No.: US 11,380,726 B2
(45) Date of Patent: Jul. 5, 2022

(54) SENSOR DEVICE

(71) Applicant: SAMSUNG ELECTRONICS CO., LTD., Suwon-si (KR)

(72) Inventor: Hyunsu Jun, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 196 days.

(21) Appl. No.: 16/904,895

(22) Filed: Jun. 18, 2020

(65) Prior Publication Data

US 2021/0134871 A1     May 6, 2021

(30) Foreign Application Priority Data

Nov. 1, 2019  (KR) .......................... 10-2019-0138739

(51) Int. Cl.
*H01L 27/146*     (2006.01)

(52) U.S. Cl.
CPC .. *H01L 27/14636* (2013.01); *H01L 27/14621* (2013.01); *H01L 27/14627* (2013.01)

(58) Field of Classification Search
CPC ......... H01L 27/14636; H01L 27/14621; H01L 27/14627; H01L 27/14605; H01L 27/14634; H01L 27/14683; H01L 23/481; H01L 23/525; H01L 24/97
USPC ....................................................... 257/459
See application file for complete search history.

(56) References Cited

U.S. PATENT DOCUMENTS

| | | | |
|---|---|---|---|
| 9,041,840 B2 | 5/2015 | Borthakur et al. | |
| 9,076,715 B2 | 7/2015 | Tsai et al. | |
| 9,136,293 B2 | 9/2015 | Yee et al. | |
| 9,299,738 B1 | 3/2016 | Brown et al. | |
| 9,312,292 B2 | 4/2016 | Kao | |
| 9,397,137 B2 | 7/2016 | Yu et al. | |
| 9,899,442 B2 | 2/2018 | Katkar | |
| 10,157,958 B2 * | 12/2018 | Lin ................... | H01L 27/14627 |
| 2012/0248580 A1 * | 10/2012 | Matsugai ................ | H01L 25/50 257/621 |
| 2017/0207158 A1 * | 7/2017 | Kang .................. | H01L 25/0657 |
| 2017/0373018 A1 | 12/2017 | Suzuki et al. | |
| 2018/0138225 A1 * | 5/2018 | Kim .................. | H01L 27/14645 |
| 2019/0214423 A1 * | 7/2019 | Kim .................. | H01L 27/14634 |
| 2020/0091217 A1 * | 3/2020 | Horikoshi ............. | H01L 23/528 |
| 2021/0104571 A1 * | 4/2021 | Shohji ............... | H01L 21/76898 |

FOREIGN PATENT DOCUMENTS

WO    WO 2019/132961 A1    7/2019

* cited by examiner

*Primary Examiner* — Dao H Nguyen
(74) *Attorney, Agent, or Firm* — Lee IP Law, P.C.

(57) ABSTRACT

A sensor device including an interposer including a first via and a lower pad, the lower pad being on a bottom surface of the interposer; an image sensor chip on a top surface of the interposer, the image sensor chip including a logic chip and a sensing chip on the logic chip, the logic chip including first wiring patterns and a second via, and the sensing chip including second wiring patterns; a conductive structure penetrating a portion of the logic chip and the sensing chip, the conductive structure being connected to at least one of the first wiring patterns and at least one of the second wiring patterns; and a passivation layer on an inner surface of the conductive structure, wherein a side surface of the interposer is coplanar with a side surface of the image sensor chip.

20 Claims, 13 Drawing Sheets

SENSOR DEVICE

CROSS-REFERENCE TO RELATED APPLICATION

Korean Patent Application No. 10-2019-0138739, filed on Nov. 1, 2019, in the Korean Intellectual Property Office, and entitled: "Sensor Device," is incorporated by reference herein in its entirety.

BACKGROUND

1. Field

Embodiments relate to a sensor device.

2. Description of the Related Art

An image sensor is an electronic device configured to convert optical data, in which one-dimensional or multi-dimensional image information is contained, into electric signals. The image sensor may be a complementary metal-oxide semiconductor (CMOS) image sensor or a charge-coupled device (CCD) image sensor. The image sensor may be used for, e.g., cameras, camcorders, multimedia personal computers, or security cameras, and demands for the image sensor are rapidly increasing.

In the semiconductor industry, various package technologies have been developed to meet an increasing demand for a semiconductor device and an electronic product with a large capacity, a thin thickness, and a small size.

SUMMARY

The embodiments may be realized by providing a sensor device including an interposer including a first via and a lower pad, the lower pad being on a bottom surface of the interposer; an image sensor chip on a top surface of the interposer, the image sensor chip including a logic chip and a sensing chip on the logic chip, the logic chip including first wiring patterns and a second via, and the sensing chip including second wiring patterns; a conductive structure penetrating a portion of the logic chip and the sensing chip, the conductive structure being connected to at least one of the first wiring patterns and at least one of the second wiring patterns; and a passivation layer on an inner surface of the conductive structure, wherein a side surface of the interposer is coplanar with a side surface of the image sensor chip.

The embodiments may be realized by providing a sensor device including an interposer including a lower pad and a first via connected to the lower pad, the lower pad being on a bottom surface of the interposer; a re-distribution layer on a top surface of the interposer, the re-distribution layer including redistribution patterns; an image sensor chip stacked on a top surface of the re-distribution layer, the image sensor chip including a logic chip and a sensing chip stacked on the logic chip, the logic chip including a first circuit layer, and the sensing chip including a second circuit layer; a conductive structure penetrating a portion of the logic chip and the sensing chip and having a recess; and a passivation layer in the recess and covering an inner surface of the conductive structure, wherein the first circuit layer includes first wiring patterns and the second circuit layer includes second wiring patterns, the conductive structure is in direct contact with at least one of the first wiring patterns in the first circuit layer and is in direct contact with at least one of the second wiring patterns in the second circuit layer, and a side surface of the interposer is vertically aligned to a side surface of the image sensor chip.

The embodiments may be realized by providing a sensor device including an interposer including a lower pad and a first via connected to the lower pad, the lower pad being on a bottom surface of the interposer, and the first via extending in a first direction; a re-distribution layer on a top surface of the interposer, the re-distribution layer including redistribution patterns; an image sensor chip stacked on a top surface of the re-distribution layer, the image sensor chip including a logic chip and a sensing chip stacked on the logic chip, the logic chip including a first circuit layer and a second via, and the sensing chip including a second circuit layer; color filters and micro lenses on a top surface of the image sensor chip; a conductive structure penetrating a portion of the logic chip and the sensing chip and having a recess; and a passivation layer in the recess and covering an inner surface of the conductive structure, wherein the first circuit layer includes first wiring patterns and the second circuit layer includes second wiring patterns, the conductive structure is in direct contact with at least one of the first wiring patterns in the first circuit layer and at least one of the second wiring patterns in the second circuit layer, a first connection pad in an upper portion of the first circuit layer is electrically connected to a second connection pad in a lower portion of the second circuit layer, the first via is electrically connected to the redistribution patterns, the second via is electrically connected to the first wiring patterns and the redistribution patterns, and a side surface of the interposer is vertically aligned to a side surface of the image sensor chip.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
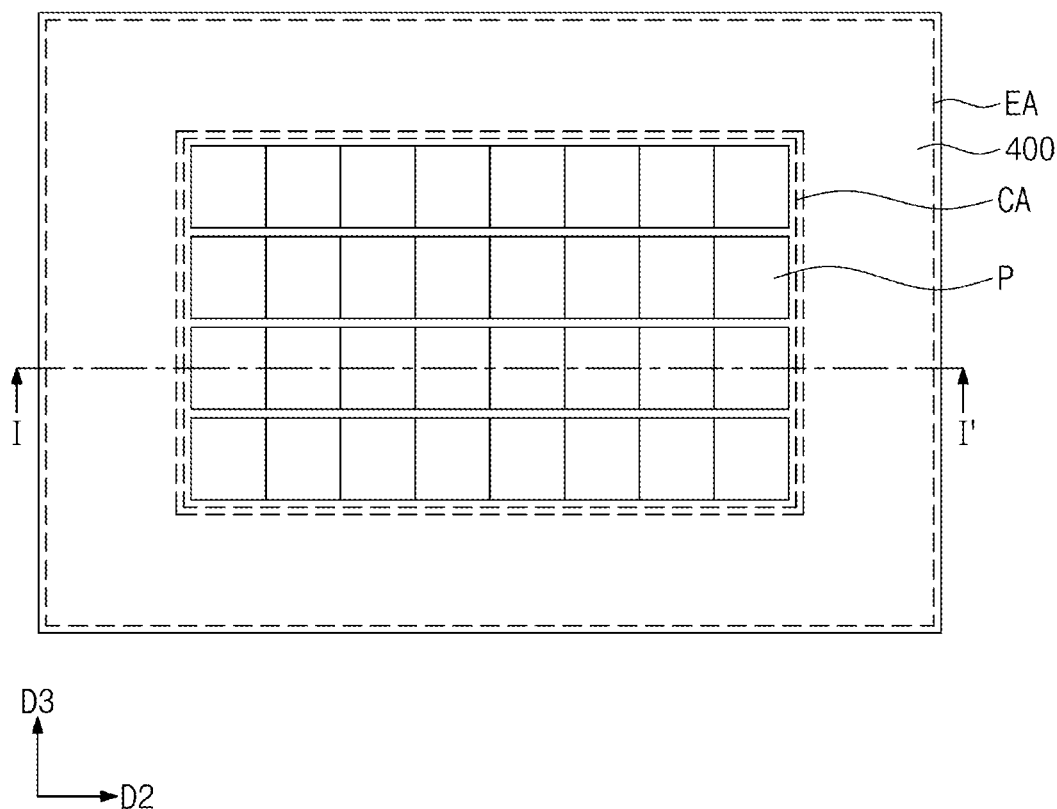
FIG. 1 illustrates a plan view of a sensor device according to some embodiments.
Figure 2:
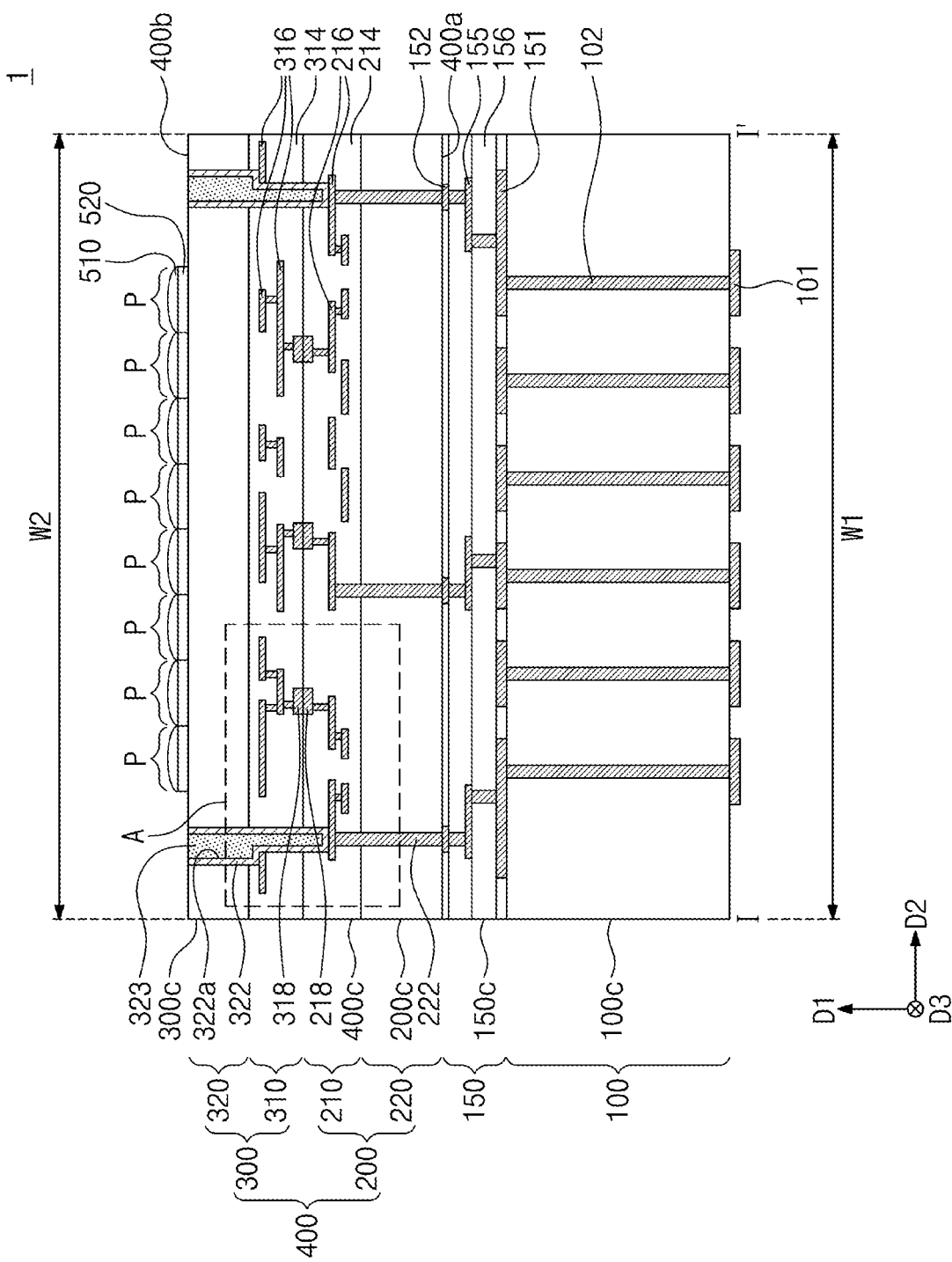
FIG. 2 illustrates a sectional view taken along line I-I' of FIG. 1.
Figure 3:
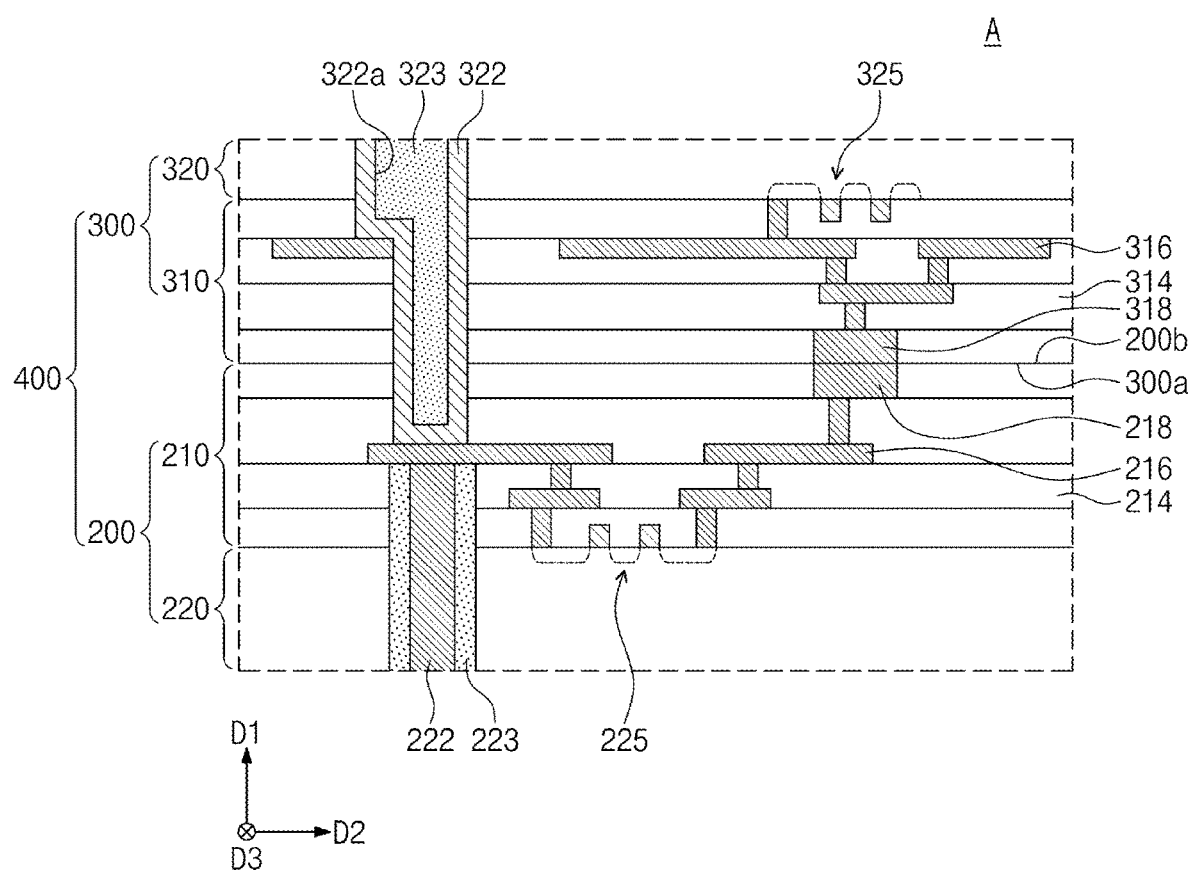
FIG. 3 illustrates an enlarged sectional view of a portion 'A' of FIG. 2.

FIG. 1 is a plan view of a sensor device according to some embodiments. FIG. 2 is a sectional view taken along line I-I' of FIG. 1. FIG. 3 is an enlarged sectional view of a portion 'A' of FIG. 2.

Referring to FIGS. 1, 2, and 3, a sensor device 1 may include an image sensor chip 400, a re-distribution layer 150, an interposer 100, a conductive structure 322 (e.g., as a part of a sensing chip 300 of the image sensor chip 400), color filters 510, and micro lenses 520.

The image sensor chip 400 may be on a top surface of the interposer 100. The image sensor chip 400 may include a logic chip 200 and a sensing chip 300 on the logic chip 200.

The sensing chip 300 may be on the logic chip 200, and a size of the image sensor chip 400 may be reduced. The image sensor chip 400 may have a first surface 400a and a second surface 400b that are opposite to each other. In an implementation, the first surface 400a may be a front surface of the image sensor chip 400, and the second surface 400b may be a rear surface of the image sensor chip 400. Hereinafter, a first direction D1 will be used to designate a direction perpendicular to the second surface 400b of the image sensor chip 400. A second direction D2 will be used to designate a direction that is parallel to the second surface 400b of the image sensor chip 400 and is perpendicular to the first direction D1. A third direction D3 will be used to designate a direction perpendicular to both of the first and second directions D1 and D2. In the present specification, a size of an element may be represented by a width of the element. The width may be a length of the element measured in the second direction D2. When viewed in a plan view (e.g., along the first direction D1), a size of the image sensor chip 400 may be substantially equal to a size of the interposer 100. In an implementation, a width W1 of the interposer 100 may be substantially equal to a width W2 of the image sensor chip 400. A planar area of the interposer 100 may be substantially equal to a planar area of the image sensor chip 400. In the present specification, the "substantial" sameness of the widths may mean that a difference between widths in consideration is within an error margin allowed for the relevant process. As shown in FIG. 2, a side surface 400c of the image sensor chip 400 may be vertically aligned to a side surface 100c of the interposer 100. In an implementation, the side surface 400c of the image sensor chip 400 may be coplanar with the side surface 100c of the interposer 100. The side surface 400c of the image sensor chip 400 may be defined by a side surface 200c of the logic chip 200 and a side surface 300c of the sensing chip 300. In an implementation, the surface 200c of the logic chip 200 and the side surface 300c of the sensing chip 300 may be vertically aligned to each other.

The image sensor chip 400 may be disposed such that the first surface 400a faces the interposer 100. Light may be incident onto the second surface 400b of the image sensor chip 400. The image sensor chip 400 may include pixels P on the second surface 400b. When viewed in a plan view, the pixels P may be in a center region CA of the image sensor chip 400. The image sensor chip 400 may be configured to sense a subject and to output the sensed result as electrical signals. The color filters 510 and the micro lenses 520 may be on the second surface 400b of the image sensor chip 400. In an implementation, each color filter 510 and each micro lens 520 may be sequentially disposed on a corresponding one of the pixels P.

The re-distribution layer 150 may be between the interposer 100 and the image sensor chip 400 (e.g., in the first direction D1). In an implementation, the re-distribution layer 150 may be on the first surface 400a of the image sensor chip 400. The logic chip 200 may include a top surface 200b and an opposite surface facing (e.g., a direction opposite to) the top surface 200b. The opposite surface of the logic chip 200 may correspond to the first surface 400a of the image sensor chip 400. The re-distribution layer 150 may include insulating layers 156 and redistribution patterns 155. A first pad 151 may be in a lower (e.g., interposer 100-facing) portion of the re-distribution layer 150. A second pad 152 may be in an upper (e.g., image sensor chip 400-facing) portion of the re-distribution layer 150. The insulating layers 156 may be on the first surface 400a of the image sensor chip 400. Each of the insulating layers 156 may be formed of or include an insulating material. The redistribution patterns 155 may include at least one conductive layer and at least one conductive via. The conductive layer may be between the insulating layers 156. The conductive via may penetrate at least one of the insulating layers 156 and may be coupled to the conductive layer. The first pad 151 may be electrically connected to the second pad 152 through the redistribution patterns 155. The first pad 151 may not be aligned to the second pad 152, when viewed in a plan view. In an implementation, the redistribution patterns 155 may be provided, and the second pad 152 may be freely disposed, regardless of a position of a first via 102 of the interposer 100. In an implementation, it is possible to increase a degree of freedom in disposing circuits in the image sensor chip 400.

The interposer 100 may be on the first surface 400a of the image sensor chip 400. In an implementation, the interposer 100 may be on a bottom surface of the re-distribution layer 150 (e.g., such that the re-distribution layer 150 is between the interposer 100 and the image sensor chip 400). The interposer 100 may be formed of or include, e.g., a curable polymer, an epoxy polymer, or silicon (Si). As used herein, the term "or" is not an exclusive term, e.g., "A or B" would include A, B, or A and B. The interposer 100 may include a lower pad 101 and the first via 102. The lower pad 101 and the first via 102 may be formed of or include a conductive material. The lower pad 101 may be on a bottom surface of the interposer 100. The first via 102 may be on the lower pad 101. In an implementation, the first via 102 may be between the lower pad 101 and the first pad 151 and may extend (e.g., lengthwise) in the first direction D1. The first via 102 may vertically penetrate the interposer 100 and may be in direct contact with both of the lower pad 101 and the first pad 151. In an implementation, the redistribution patterns 155 and the lower pad 101 may be electrically connected to each other through the first via 102. The redistribution patterns 155 of the re-distribution layer 150 may receive electrical signals, which are input through the lower pad 101 and the first via 102, or send electrical signals to the lower pad 101. In the present specification, the expression "electrically connected or coupled" may mean that a plurality of elements are directly connected or coupled to each other or are indirectly connected or coupled to each other through another conductive element. In an implementation, a thickness of the interposer 100 in the first direction D1 may range from, e.g., 50 µm to 300 µm. Maintaining the thickness of the interposer 100 at 50 µm or greater may facilitate handing of a sensing substrate and a logic substrate in a fabrication process of a sensor device, which will be described below. Maintaining the thickness of the interposer 100 at 300 µm or less may facilitate a reduction in thickness of the sensor device or may help realize a small sensor device. The sensor device according to an embodiment may include the interposer 100, and it may be possible to improve the durability of the sensor device. In an implementation, due to the interposer 100 on the first surface 400a of the image sensor chip 400, it may be possible to improve the warpage issue (e.g., reduce warpage) in the image sensor chip 400 and to easily handle the sensor device in the fabrication process. The interposer 100 may include the lower pad 101 on its bottom surface, and bonding wires may not be needed to mount the sensor device on a substrate. In an implementation, it may be possible to reduce the volume of the sensor device in electronic product and to realize a small electronic product.

As described above, the image sensor chip 400 may include the logic chip 200 and the sensing chip 300 on the logic chip 200. The logic chip 200 may include a first circuit layer 210, a first base layer 220, a second via 222, and a first bonding pad 218. The first base layer 220 may include a silicon substrate. The second via 222 may penetrate the first base layer 220 and a portion of the first circuit layer 210. The second via 222 may be on the second pad 152 and may be connected to the second pad 152 and at least one of first wiring patterns 216. The second via 222 may be aligned to or overlapped with the second pad 152, when viewed in a plan view. The second via 222 may be electrically connected to the lower pad 101 through the redistribution patterns 155 and the first via 102.

Referring to FIG. 3 in conjunction with FIG. 2, the first circuit layer 210 may include first insulating layers 214, first integrated circuits 225, and first wiring patterns 216. The first integrated circuits 225 may be on the first base layer 220. The first integrated circuits 225 may include transistors. The first wiring patterns 216 may be in the first insulating layers 214 and may be coupled to the first integrated circuits 225. The first bonding pad 218 may be in an upper portion of the first circuit layer 210 of the logic chip 200 and may be coupled to the first wiring patterns 216. The first wiring patterns 216 may include at least one first metal pattern and at least one first metal via. The first metal pattern may be between the first insulating layers 214, and the first metal via may penetrate at least one of the first insulating layers 214 and may be coupled to the first metal pattern. The first wiring patterns 216 may electrically connect the second via 222 and the first integrated circuits 225 to each other.

The sensing chip 300 may include a second circuit layer 310, a second base layer 320, and a second bonding pad 318. The pixels P may be provided on a top surface of the sensing chip 300. The second base layer 320 may include a silicon substrate. The second circuit layer 310 may be closer to the logic chip 200 (e.g., in the first direction D1) than the second base layer 320 is to the logic chip 200. The second circuit layer 310 may include second insulating layers 314, second integrated circuits 325, and second wiring patterns 316. The second integrated circuits 325 may include sensing transistors. The second integrated circuits 325 may be electrically connected to the second wiring patterns 316. The second bonding pad 318 may be in a lower portion of the second circuit layer 310 of the sensing chip 300 and may be coupled to the second wiring patterns 316. The second wiring patterns 316 may include at least one second metal pattern and at least one second metal via. The second metal pattern may be between the second insulating layers 314, and the second metal via may penetrate at least one of the second insulating layers 314 and may be coupled to the second metal pattern. The second integrated circuits 325 may be electrically connected to the first integrated circuits 225 through the first and second bonding pads 218 and 318.

The conductive structure 322 may be in the image sensor chip 400. In an implementation, the conductive structure 322 may penetrate the sensing chip 300 and at least a portion of the logic chip 200. In an implementation, the conductive structure 322 may penetrate the second base layer 320, the second circuit layer 310, and a portion of the first circuit layer 210. The conductive structure 322 may be in direct contact with at least one of the second wiring patterns 316 and at least one of the first wiring patterns 216. The second integrated circuits 325 may be electrically connected to the conductive structure 322 through the first wiring patterns 216 and the second wiring patterns 316. The conductive structure 322 may be used as an electrical connection path between the sensing chip 300 and the logic chip 200. When viewed in a plan view, the conductive structure 322 may be in an edge region EA of the image sensor chip 400. In an implementation, the conductive structure 322 may be between the side surface 400c of the image sensor chip 400 and the pixels P (e.g., in the second direction D2). The conductive structure 322 may be spaced apart from the pixels P (e.g., in the second direction D2). The conductive structure 322 may have a recess 322a. A passivation layer 323 may be provided in the recess 322a. The passivation layer 323 may cover an inner surface of the conductive structure 322. In an implementation, the passivation layer 323 may extend to partially cover the top surface of the sensing chip 300 or the second surface 400b of the image sensor chip 400.

Figure 4:
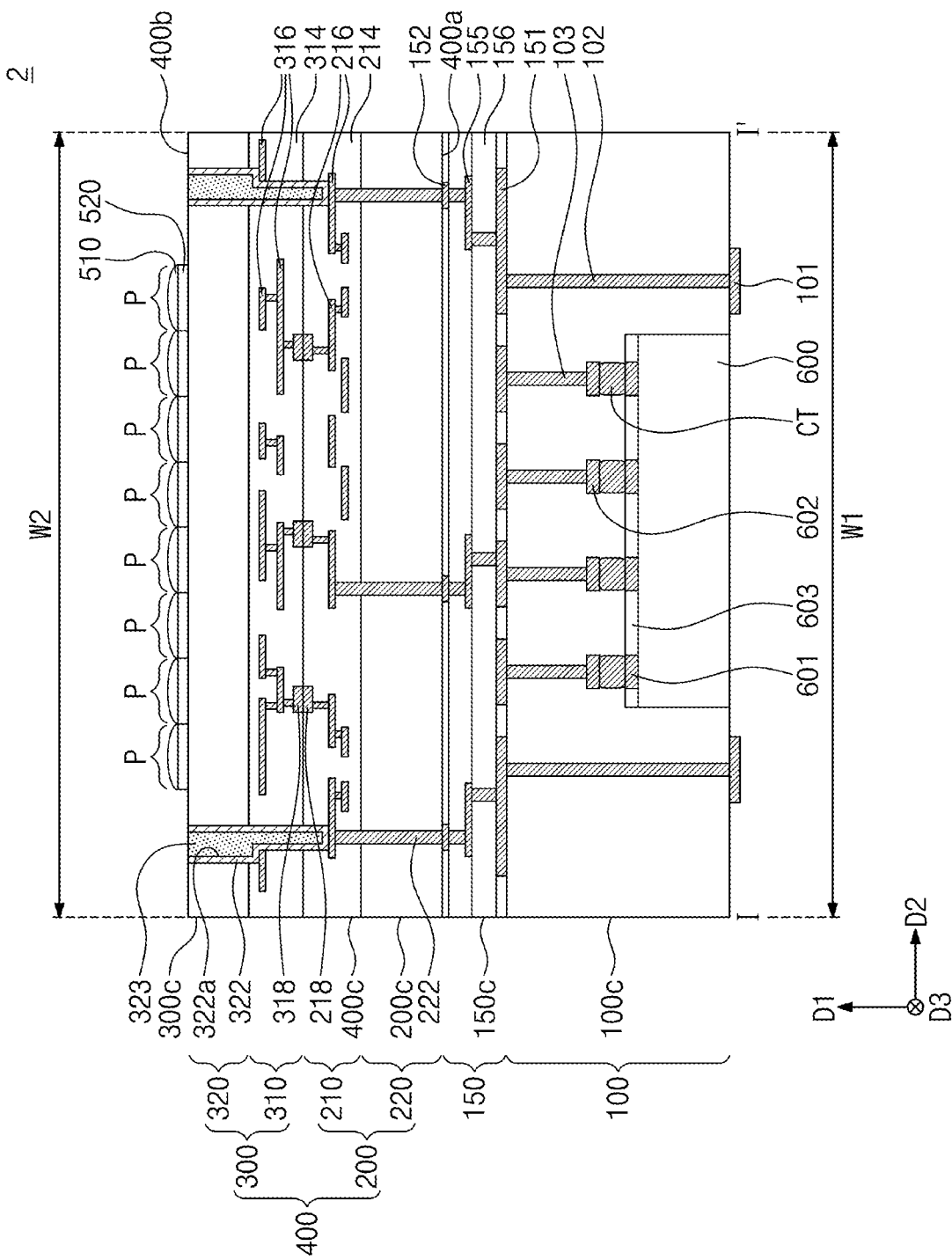
FIG. 4 illustrates a sectional view of a sensor device according to some embodiments.

FIG. 4 is a sectional view of a sensor device according to some embodiments. For concise description, a previously described element may be identified by the same reference number without repeating an overlapping description thereof.

Referring to FIG. 4, a sensor device 2 may further include a memory chip 600, in addition to the image sensor chip 400, the re-distribution layer 150, the interposer 100, the conductive structure 322, the color filters 510, and the micro lenses 520. The image sensor chip 400, the re-distribution layer 150, the conductive structure 322, the color filters 510, and the micro lenses 520 may be substantially the same as those described with reference to FIGS. 1 to 3.

The memory chip 600 may be in the interposer 100. The interposer 100 may cover a side surface of the memory chip 600 and may not cover a bottom surface of the memory chip 600. In an implementation, the memory chip 600 may be at least one of DRAM, SRAM, MRAM, or FLASH memory chips. The memory chip 600 may include silicon. A top surface of the memory chip 600 may serve as an active surface. The memory chip 600 may include a circuit pattern layer and a chip pad 601. In an implementation, the circuit pattern layer may include a plurality of layers. The chip pad 601 may be on the memory chip 600 and may be electrically connected to integrated devices in the circuit pattern layer. Hereinafter, in the present specification, an expression "an element is electrically connected to a circuit pattern layer or a circuit layer" means that the element is electrically connected to integrated devices or integrated circuits, which are provided in the circuit pattern layer or the circuit layer. In addition, an expression "an element is electrically connected to the memory chip 600" means that the element is electrically connected to integrated devices provided in the memory chip 600. In an implementation, the chip pad 601 may be formed of or include a metallic material (e.g., aluminum).

The interposer 100 may further include a connection terminal CT, a connection pad 602, and a third via 103, in addition to the lower pad 101 and the first via 102. The first via 102 and the lower pad 101 may be substantially the same as those described with reference to FIG. 2. The first via 102 may be spaced apart from the memory chip 600. In an implementation, the first via 102 may be between the memory chip 600 and the side surface 100c of the interposer 100, when viewed in a plan view.

The connection terminal CT may be on the top surface of the memory chip 600. In an implementation, the connection terminal CT may be between the chip pad 601 and the connection pad 602. The connection terminal CT may be coupled to the chip pad 601 and the connection pad 602. The connection terminal CT may be in the form of a bump, a solder ball, or a pillar. The connection terminal CT may be formed of or include a metallic material. In an implementation, the connection terminal CT may be formed of or include, e.g., silver (Ag), tin (Sn), bismuth (Bi), or alloys thereof. The connection terminal CT may electrically connect integrated devices, which are provided as a part of a circuit pattern layer of the memory chip 600, to the connection pad 602. Accordingly, the memory chip 600 may be electrically connected to the image sensor chip 400 through the connection terminal CT and the third via 103. This makes it possible to reduce a length of a connection path between the memory chip 600 and the image sensor chip 400 and to increase a speed of signals to be transmitted between the memory chip 600 and the image sensor chip 400. The connection pad 602 may be between the connection terminal CT and the third via 103. The connection pad 602 may electrically connect the connection terminal CT to the third via 103.

The third via 103 may be between the first pad 151 and the connection pad 602. The third via 103 may extend parallel to the first direction D1 to penetrate a portion of the interposer 100. The third via 103 may be overlapped with the memory chip 600, when viewed in a plan view. The third via 103 may be a signal transmission path between the memory chip 600 and the re-distribution layer 150. The third via 103 may be formed of or include a conductive material. The memory chip 600 may output electrical signals, which are generated by the integrated devices in the circuit pattern layer, to the outside or may receive electrical signals from the outside through the chip pad 601, the connection terminal CT, the connection pad 602, the third via 103, the first pad 151, the redistribution patterns 155, the first via 102, and the lower pad 101.

Figure 5:
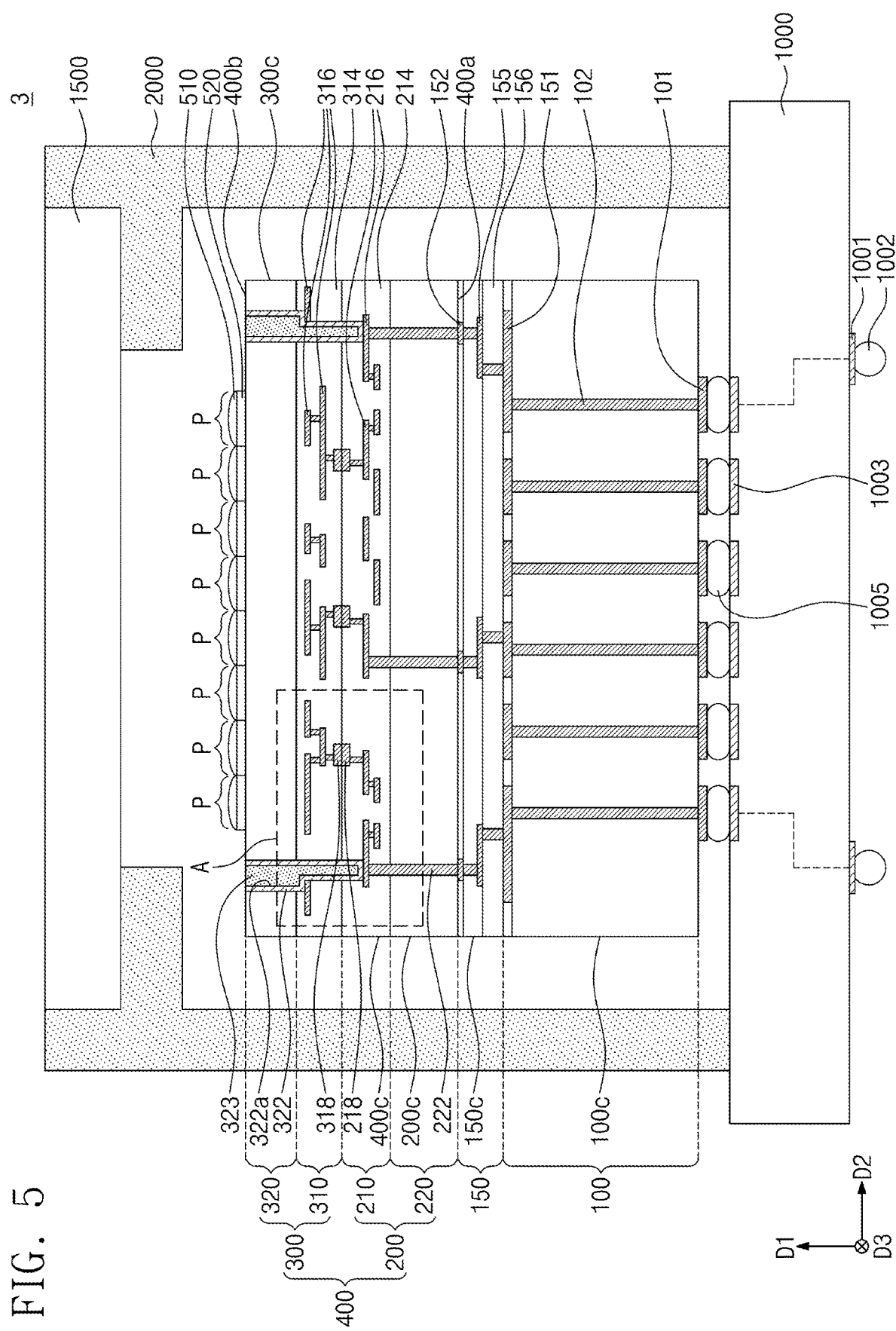
FIG. 5 illustrates a sectional view of a sensor device according to some embodiments.

FIG. 5 is a sectional view of a sensor device according to some embodiments. For concise description, a previously described element may be identified by the same reference number without repeating an overlapping description thereof.

Referring to FIG. 5, a sensor device 3 may further include a substrate 1000, a connector 1005, a holder 2000, and a transparent cover 1500, in addition to the image sensor chip 400, the re-distribution layer 150, the interposer 100, the conductive structure 322, the color filters 510, and the micro lenses 520. The image sensor chip 400, the re-distribution layer 150, the interposer 100, the conductive structure 322, the color filters 510, and the micro lenses 520 may be substantially the same as those described with reference to FIGS. 1 to 3.

The substrate 1000 may be, e.g., a printed circuit board (PCB). The substrate 1000 may be flexible. An upper substrate pad 1003 may be in an upper portion of the substrate 1000. A lower substrate pad 1001 may be below the substrate 1000. An outer terminal 1002 may be on a bottom surface of the lower substrate pad 1001. The outer terminal 1002 may be in the form of a solder ball. The outer terminal 1002, the upper substrate pad 1003, and the lower substrate pad 1001 may be formed of or include a conductive material. The outer terminal 1002 may be electrically connected to the upper substrate pad 1003 through the substrate 1000, as depicted by the dotted line.

The connector 1005 may be between the lower pad 101 and the upper substrate pad 1003. The connector 1005 may electrically connect the lower pad 101 to the upper substrate pad 1003. In an implementation, the connector 1005 may be used to transmit electrical signals, which are input from the outside through the substrate 1000, to the image sensor chip 400 or to output electrical signals, which are generated by the image sensor chip 400, to the outside.

The holder 2000 may be on the substrate 1000 to support the transparent cover 1500. The holder 2000 may be horizontally spaced apart from the image sensor chip 400 (e.g., spaced apart in the second direction D2). When viewed in a plan view, the holder 2000 may be overlapped with a portion of the edge region EA of the image sensor chip 400. The holder 2000 may not be overlapped with the pixels P, when viewed in a plan view. The holder 2000 may include an engineering plastic. The transparent cover 1500 may be on the holder 2000 to face the image sensor chip 400 and may be spaced apart from the image sensor chip 400 (e.g., in the first direction D1). The transparent cover 1500 may be formed of or include a transparent material (e.g., glass), allowing light to pass therethrough.

FIGS. 6A to 6D are sectional views of stages in a method of fabricating a sensor device according to some embodiments. For concise description, a previously described element may be identified by the same reference number without repeating an overlapping description thereof. The wiring patterns and the integrated devices, which are provided in a circuit layer, may be omitted or simplified in the following figures.

Figure 6A:
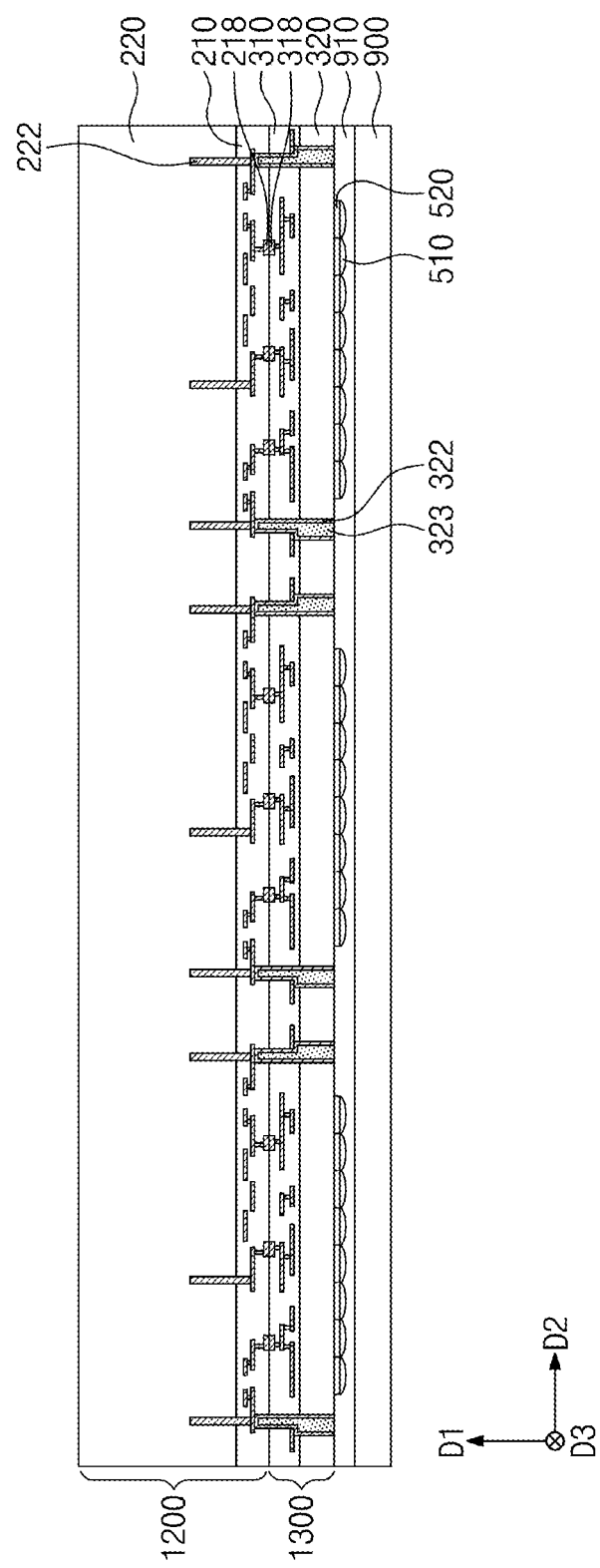
FIGS. 6A to 6D illustrate sectional views of stages in a method of fabricating a sensor device according to some embodiments.

Referring to FIG. 6A in conjunction with FIG. 2, a sensing substrate 1300 may be prepared. In an implementation, the sensing substrate 1300 may be fabricated by forming the color filters 510, the micro lenses 520, the second circuit layer 310, and the second bonding pad 318 on the second base layer 320. The sensing substrate 1300 may be, e.g., a wafer. The second bonding pad 318 may be formed of or include a metallic material (e.g., copper).

A logic substrate 1200 may be prepared. In an implementation, the logic substrate 1200 may be fabricate by forming the first circuit layer 210, the first bonding pad 218, and the second via 222 on the first base layer 220. The logic substrate 1200 may be, e.g., a wafer. The first integrated circuits 225 (e.g., see FIG. 3) and the second via 222 of the first circuit layer 210 may be formed by a via-middle process. The second via 222 may be formed to penetrate a portion of the first base layer 220 from a surface of the first base layer 220. Thereafter, the first circuit layer 210 may be formed by forming the first insulating layers 214 and the first wiring patterns 216 on the surface of the first base layer 220. The first bonding pad 218 may be formed on the first circuit layer 210. In an implementation, the first bonding pad 218 may be formed of or include a metallic material (e.g., copper).

The logic substrate 1200 may be electrically connected to the sensing substrate 1300. In an implementation, the electric connection may be achieved by a direct bonding process. In an implementation, the logic substrate 1200 may be placed on the sensing substrate 1300 such that the first bonding pad 218 is aligned to or with the second bonding pad 318. A thermal treatment process may be performed on the logic substrate 1200 and the sensing substrate 1300 to bond the second bonding pad 318 to the first bonding pad 218. The bonding process (e.g., the thermal treatment process) on the logic substrate 1200 and the sensing substrate 1300 may be performed at a temperature of about 350° C. to about 400° C.

A conductive structure may be formed, after the bonding process of the logic substrate 1200 and the sensing substrate 1300. The sensing substrate 1300 and a portion of the logic substrate 1200 may be etched to form a first recess. The first recess may expose a portion of the second wiring patterns 316 and a portion of the first wiring patterns 216. The conductive structure may be formed by conformally covering an inner surface of the first recess with a metallic material. In an implementation, the conductive structure may be formed to have a second recess. A passivation layer may be formed in the second recess. The passivation layer may fill an internal space of the second recess of the conductive structure. In an implementation, a top surface of the passivation layer may be coplanar with the adjacent surface of the sensing substrate 1300. A top surface of the passivation layer may be coplanar with the second surface 400*b* of the image sensor chip 400 (e.g., in a resultant structure). The second surface 400*b* may be a top surface of the image sensor chip 400. The passivation layer may be formed of or include at least one of insulating materials. In an implementation, the passivation layer may extend to cover at least a portion of a top surface of the sensing substrate 1300.

Figure 6B:
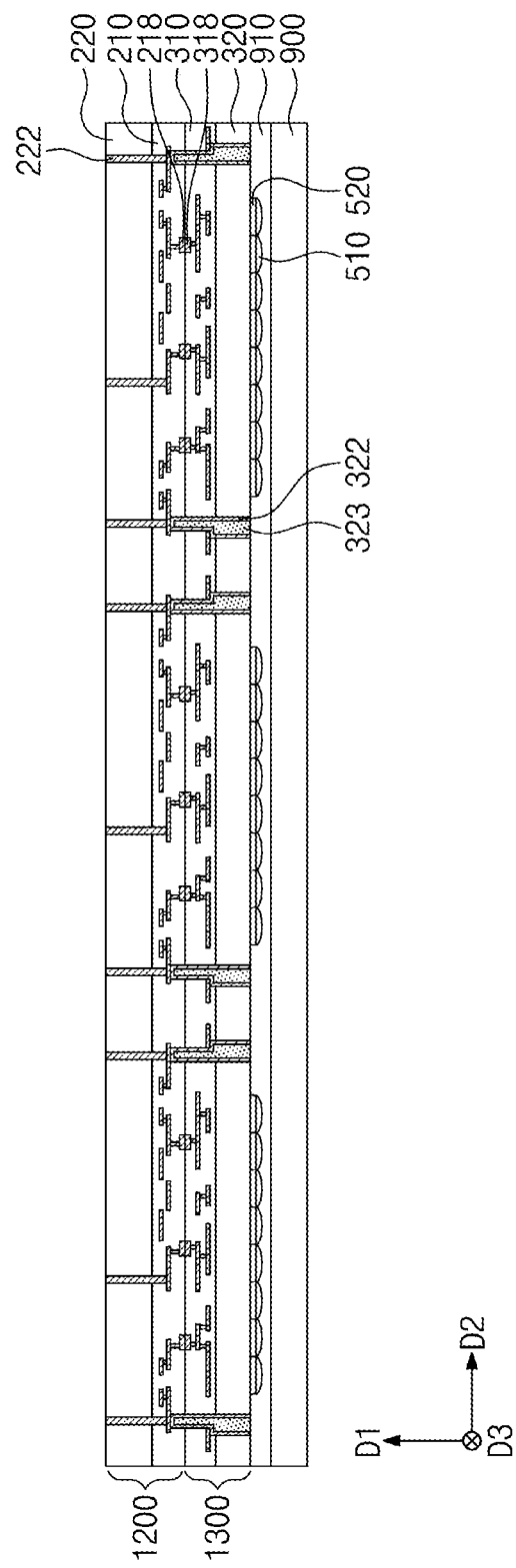

Referring to FIGS. 6A and 6B, the sensing substrate 1300 may be provided on a carrier substrate 900. A carrier adhesive layer 910 may be between the carrier substrate 900 and the sensing substrate 1300. Thereafter, a process of thinning the logic substrate 1200 may be performed to expose the second via 222. In an implementation, a grinding process may be performed on an opposite surface of the logic substrate 1200 to expose the second via 222. The opposite surface of the logic substrate 1200 may correspond to the first surface 400*a* of the image sensor chip 400 (e.g., of FIG. 2).

Figure 6C:
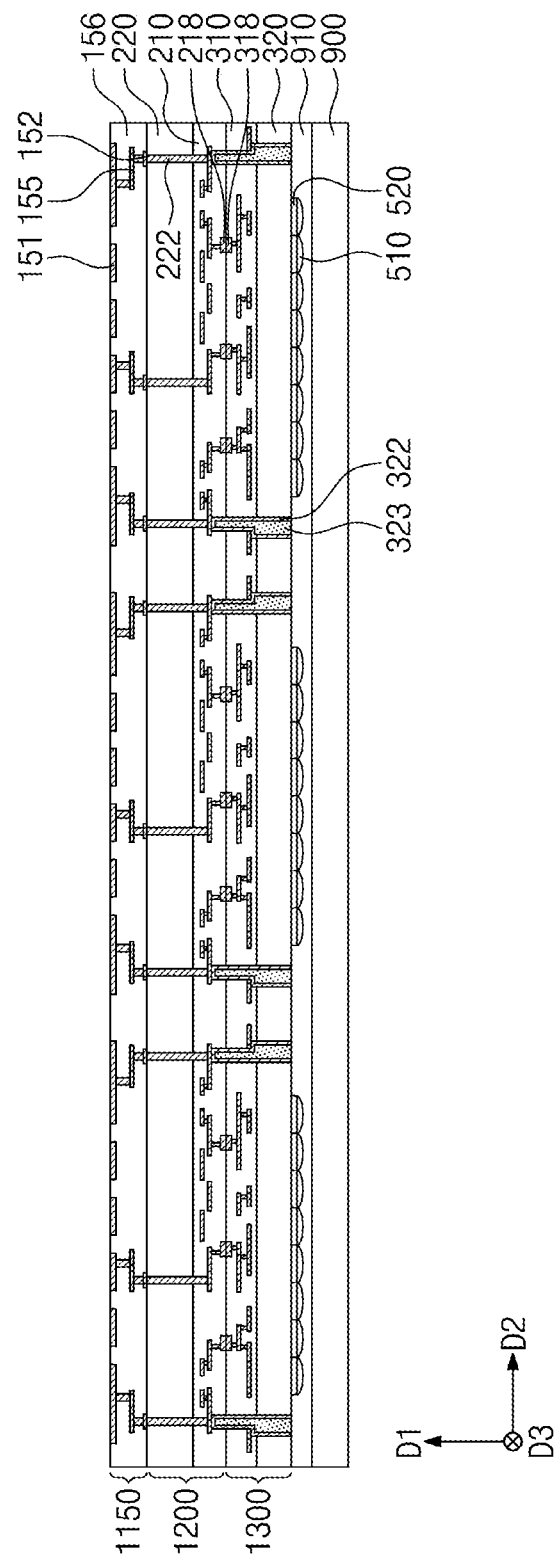

Referring to FIG. 6C, a re-distribution layer 1150 may be formed on the logic substrate 1200. In an implementation, the insulating layers 156, the first and second pads 151 and 152, and the redistribution patterns 155 constituting the re-distribution layer 1150 may be formed on the logic substrate 1200. The redistribution patterns 155 may be electrically connected to the second via 222.

Figure 6D:
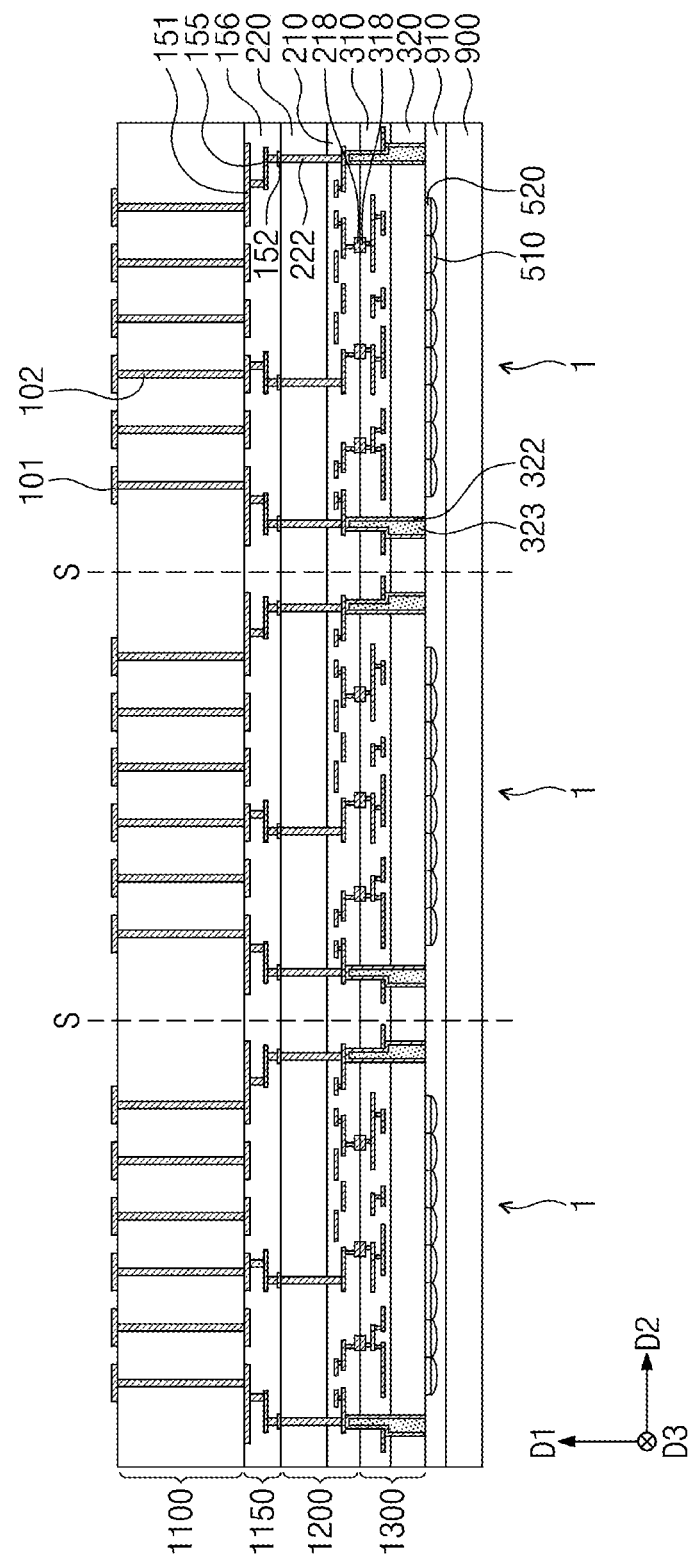

Referring to FIG. 6D, an interposer layer 1100 may be prepared. The interposer layer 1100 may be a silicon wafer. The interposer layer 1100 may be fabricated by forming the first via 102 in the silicon wafer and forming the lower pad 101 on a surface of the silicon wafer. The interposer layer 1100 may be provided on the re-distribution layer 1150 such that the lower pad 101 is exposed to the outside. The interposer layer 1100 may be electrically connected to the re-distribution layer 1150. In an implementation, the electric connection may be achieved by a direct bonding process. The direct bonding process may be performed in substantially the same manner as that described with reference to FIG. 6A. Accordingly, the first via 102 may be combined to the first pad 151.

The sensing substrate 1300, the logic substrate 1200, the re-distribution layer 1150, and the interposer layer 1100 may be sawed along the dotted line S depicted in FIG. 6D. Next, the carrier substrate 900 and the carrier adhesive layer 910 may be removed to expose the micro lenses 520. The sensor devices 1 may be fabricated by the afore-described process. The sensor devices 1 may be separated from each other by the sawing process, and the sensing chip 300, the logic chip 200, and the re-distribution layer 1150 in each of the sensor devices 1 may be fabricated to have the same width.

FIGS. 7A to 7D are sectional views of stages in a method of fabricating a sensor device according to some embodiments. For concise description, a previously described element may be identified by the same reference number without repeating an overlapping description thereof. The wiring patterns and the integrated devices, which are provided in a circuit layer, may be omitted or simplified in the following figures.

Figure 7A:
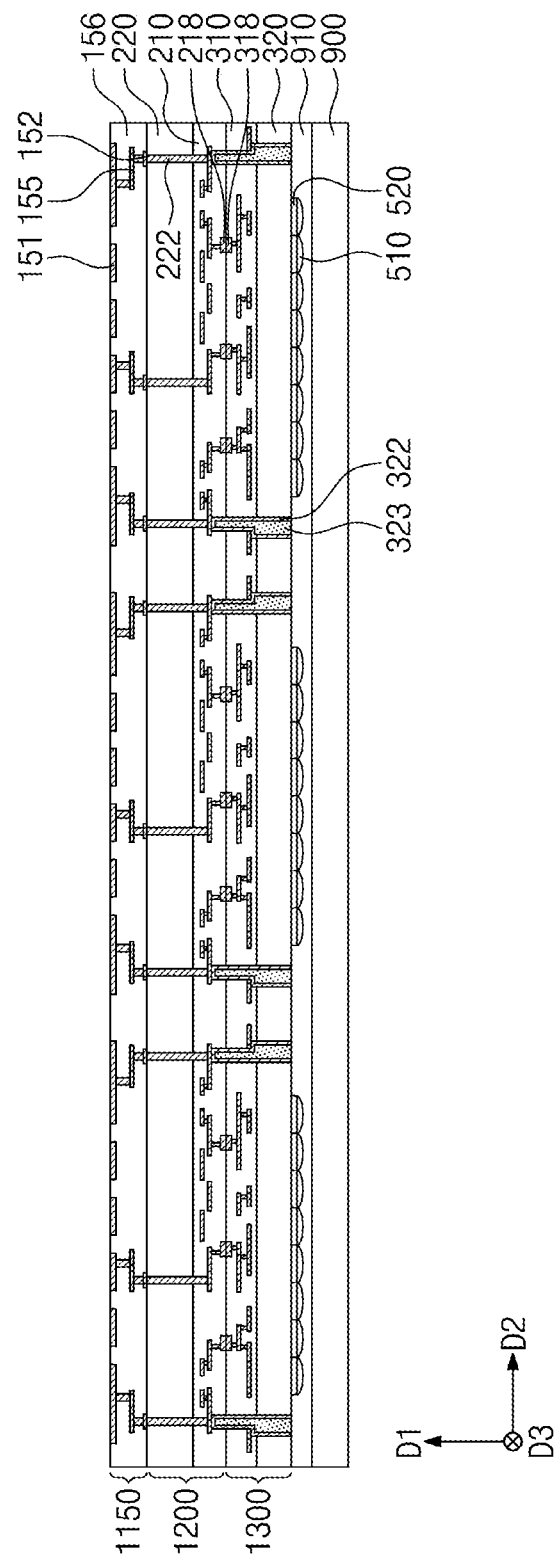
FIGS. 7A to 7D illustrate sectional views of stages in a method of fabricating a sensor device according to some embodiments.

Referring to FIG. 7A, the logic substrate 1200, the sensing substrate 1300, and the re-distribution layer 1150 may be formed on the carrier substrate 900. The logic substrate 1200, the sensing substrate 1300, and the re-distribution layer 1150 may be formed by substantially the same method as that described with reference to FIGS. 6A and 6C.

Figure 7B:
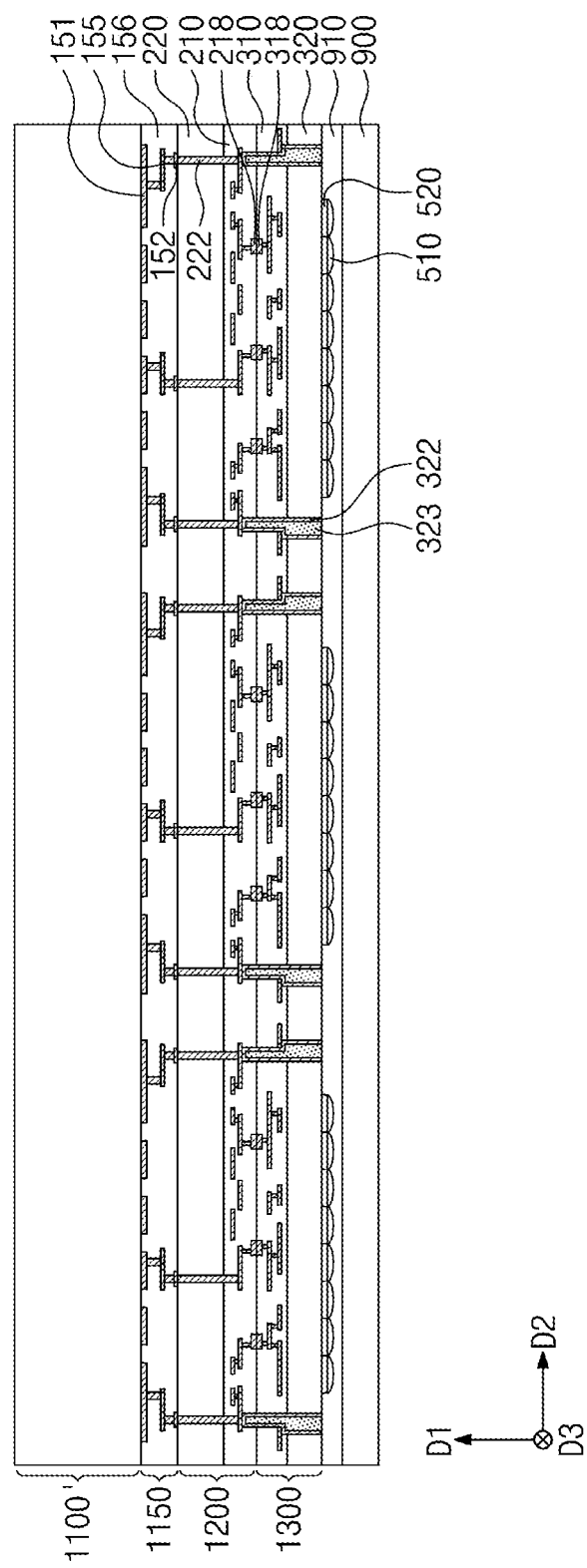

Referring to FIG. 7B, a polymer layer 1100' may be formed on the re-distribution layer 1150. The polymer layer 1100' may be formed of or include a curable polymer material. A process of applying heat or light to the polymer layer 1100' may be performed. Thus, the polymer layer 1100' may be firmly cured.

Figure 7C:
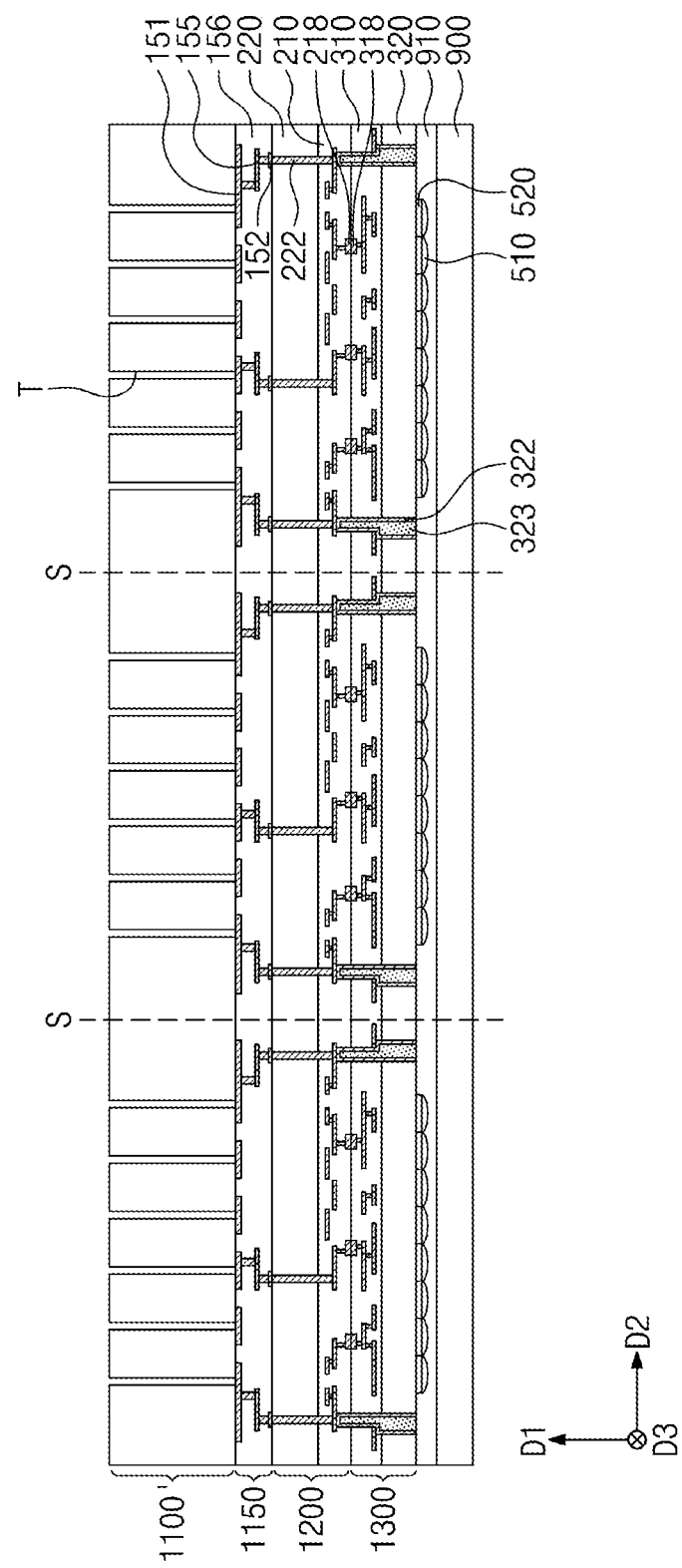

Referring to FIG. 7C, a penetration hole T may be formed to penetrate the polymer layer 1100'. The penetration hole T may vertically (e.g., in the first direction D1) pass through the polymer layer 1100' and may expose the first pad 151. The penetration hole T may be formed by a laser-drill process.

Figure 7D:
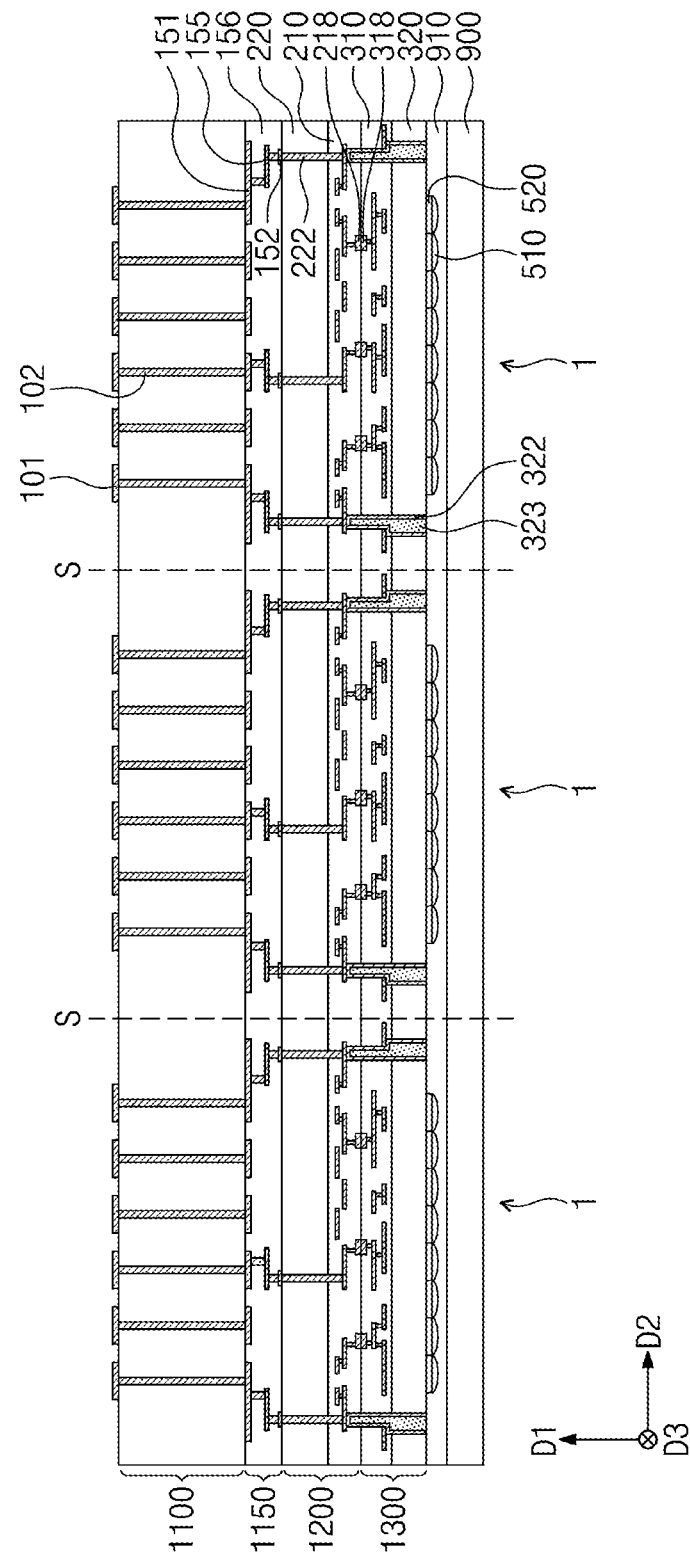

Referring to FIG. 7D, the first via 102 may be formed by filling the penetration hole T with a metallic material. The lower pad 101 may be formed, after the formation of the first via 102. Accordingly, the interposer layer 1100 may be formed.

The sensing substrate 1300, the logic substrate 1200, the re-distribution layer 1150, and the interposer layer 1100 may be sawed along the dotted line S depicted in FIG. 7D. Next, the carrier substrate 900 and the carrier adhesive layer 910 may be removed to expose the micro lenses 520. The sensor devices 1 may be fabricated by the afore-described process. The sensor devices 1 may be separated from each other by the sawing process, and the sensing chip 300, the logic chip 200, and the re-distribution layer 1150 in each of the sensor devices 1 may be fabricated to have the same width.

According to an embodiment, an interposer may be provided on a bottom surface of an image sensor chip. Vias may be provided in the interposer and may electrically connect an image sensor chip to a lower pad, which is provided on a bottom surface of the interposer. A sensor device may be mounted on a substrate through the lower pad. Accordingly, it may be possible to reduce an occupying area of the sensor device on the substrate and to realize a small electronic product.

One or more embodiments may provide a stacked image sensor.

One or more embodiments may provide a highly-integrated sensor device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A sensor device, comprising:
an interposer including a first via and a lower pad, the lower pad being on a bottom surface of the interposer;
an image sensor chip on a top surface of the interposer, the image sensor chip including a logic chip and a sensing chip on the logic chip, the logic chip including first wiring patterns and a second via, and the sensing chip including second wiring patterns;
a conductive structure penetrating a portion of the logic chip and the sensing chip, the conductive structure being connected to at least one of the first wiring patterns and at least one of the second wiring patterns; and a passivation layer on an inner surface of the conductive structure, wherein a side surface of the interposer is coplanar with a side surface of the image sensor chip.

2. The sensor device as claimed in claim 1, wherein the side surface of the image sensor chip includes a side surface of the sensing chip and a side surface of the logic chip.

3. The sensor device as claimed in claim 1, wherein the conductive structure is in an edge region of the image sensor chip, when viewed in a plan view.

4. The sensor device as claimed in claim 1, further comprising micro lenses on a top surface of the sensing chip, wherein the conductive structure is laterally spaced apart from the micro lenses, when viewed in a plan view.

5. The sensor device as claimed in claim 1, further comprising a re-distribution layer between the logic chip and the interposer, wherein:
the re-distribution layer includes a first pad in a lower portion of the re-distribution layer, and
the first via is between the first pad and the lower pad and is in direct contact with the first pad and the lower pad.

6. The sensor device as claimed in claim 5, wherein:
the re-distribution layer further includes a second pad in an upper portion of the re-distribution layer, and
the second via is between the second pad and the first wiring patterns and connects the second pad to at least one of the first wiring patterns.

7. The sensor device as claimed in claim 1, wherein the interposer includes a curable polymer, an epoxy polymer, or silicon.

8. The sensor device as claimed in claim 1, wherein a width of the interposer is substantially equal to a width of the image sensor chip.

9. The sensor device as claimed in claim 1, wherein a planar area of the interposer is substantially equal to a planar area of the image sensor chip.

10. A sensor device, comprising:
an interposer including a lower pad and a first via connected to the lower pad, the lower pad being on a bottom surface of the interposer;
a re-distribution layer on a top surface of the interposer, the re-distribution layer including redistribution patterns;
an image sensor chip stacked on a top surface of the re-distribution layer, the image sensor chip including a logic chip and a sensing chip stacked on the logic chip, the logic chip including a first circuit layer, and the sensing chip including a second circuit layer;
a conductive structure penetrating a portion of the logic chip and the sensing chip and having a recess; and
a passivation layer in the recess and covering an inner surface of the conductive structure,
wherein:
the first circuit layer includes first wiring patterns and the second circuit layer includes second wiring patterns,
the conductive structure is in direct contact with at least one of the first wiring patterns in the first circuit layer and is in direct contact with at least one of the second wiring patterns in the second circuit layer, and
a side surface of the interposer is vertically aligned to a side surface of the image sensor chip.

11. The sensor device as claimed in claim 10, wherein:
the logic chip includes a second via, the second via being connected to the first wiring patterns and penetrating the logic chip,
the first via electrically connects the lower pad to the redistribution patterns, and
the second via electrically connects the first wiring patterns to the redistribution patterns.

12. The sensor device as claimed in claim 10, wherein a top surface of the passivation layer is coplanar with a top surface of the image sensor chip.

13. The sensor device as claimed in claim 10, further comprising micro lenses on a top surface of the image sensor chip,
wherein the conductive structure is between the side surface of the image sensor chip and the micro lenses, when viewed in a plan view.

14. The sensor device as claimed in claim 10, wherein the conductive structure is in an edge region of the image sensor chip, when viewed in a plan view.

15. The sensor device as claimed in claim 10, wherein the side surface of the interposer is coplanar with the side surface of the image sensor chip and a side surface of the re-distribution layer.

16. The sensor device as claimed in claim 10, wherein a width of the interposer is substantially equal to a width of the image sensor chip.

17. The sensor device as claimed in claim 10, further comprising:
a substrate connected to the lower pad;
a holder on the substrate and spaced apart from the image sensor chip when viewed in a plan view; and
a transparent cover on the holder.

18. The sensor device as claimed in claim 10, further comprising a memory chip in the interposer,
wherein:
the interposer further includes a third via electrically connecting the memory chip to the redistribution patterns, and
the first via is spaced apart from the memory chip.

19. A sensor device, comprising:
an interposer including a lower pad and a first via connected to the lower pad, the lower pad being on a bottom surface of the interposer, and the first via extending in a first direction;
a re-distribution layer on a top surface of the interposer, the re-distribution layer including redistribution patterns;
an image sensor chip stacked on a top surface of the re-distribution layer, the image sensor chip including a logic chip and a sensing chip stacked on the logic chip, the logic chip including a first circuit layer and a second via, and the sensing chip including a second circuit layer;
color filters and micro lenses on a top surface of the image sensor chip;
a conductive structure penetrating a portion of the logic chip and the sensing chip and having a recess; and
a passivation layer in the recess and covering an inner surface of the conductive structure,
wherein:
the first circuit layer includes first wiring patterns and the second circuit layer includes second wiring patterns,
the conductive structure is in direct contact with at least one of the first wiring patterns in the first circuit layer and at least one of the second wiring patterns in the second circuit layer, a first connection pad in an upper portion of the first circuit layer is electrically connected to a second connection pad in a lower portion of the second circuit layer, the first via is electrically connected to the redistribution patterns, the second via is electrically connected to the first wiring patterns and the redistribution patterns, and a side surface of the interposer is vertically aligned to a side surface of the image sensor chip.

20. The sensor device as claimed in claim 19, further comprising:

a substrate connected to the lower pad;

a holder on the substrate and spaced apart from the image sensor chip when viewed in a plan view; and a transparent cover on the holder.

* * * * *